(12) United States Patent
Pierce

(10) Patent No.: US 6,529,022 B2
(45) Date of Patent: Mar. 4, 2003

(54) WAFER TESTING INTERPOSER FOR A CONVENTIONAL PACKAGE

(75) Inventor: John L. Pierce, Dallas, TX (US)

(73) Assignee: Eaglestone Pareners I, LLC, Long Beach, CA (US)

( * ) Notice: Subject to any disclaimer, the term of this patent is extended or adjusted under 35 U.S.C. 154(b) by 0 days.

(21) Appl. No.: 09/737,925

(22) Filed: Dec. 15, 2000

(65) Prior Publication Data

US 2002/0075022 A1 Jun. 20, 2002

(51) Int. Cl.[7] ............ G01R 31/02; H05K 7/06; H05K 1/00
(52) U.S. Cl. .......... 324/754; 361/777; 439/67; 439/68
(58) Field of Search ............... 324/755, 754, 324/765; 361/777, 778, 779, 768, 771; 439/60, 65, 67, 68

(56) References Cited

U.S. PATENT DOCUMENTS 5,784,262 A * 7/1998 Sherman ............... 361/777
6,256,207 B1 * 7/2001 Horiuchi et al. ............ 361/760

FOREIGN PATENT DOCUMENTS

EP          0 918 354 A2 * 5/1999 ....... H01L/21/8222

* cited by examiner

Primary Examiner—Kamand Cuneo
Assistant Examiner—Paresh Patel
(74) Attorney, Agent, or Firm—Lawrence R. Youst; Danamraj & Youst, P.C.

(57) ABSTRACT

The present invention provides a wafer interposer for electrical testing and assembly into a conventional package. The present invention provides an interposer comprising a support having an upper and a lower surface. One or more solder bumps are on the lower surface. One or more first electrical terminals are on the upper surface, substantially corresponding to the position of the solder bumps, and forming a pattern. One or more first electrical pathways pass through the surface of the support and connect the solder bumps to the first electrical terminals. One or more second electrical terminals are on the upper surface of the support. The second electrical terminals are larger in size and pitch than the first electrical terminals, and they are located within the pattern formed by the first electrical terminals. One or more second electrical pathways connect the first electrical pathways to the second electrical pathway.

13 Claims, 2 Drawing Sheets

WAFER TESTING INTERPOSER FOR A CONVENTIONAL PACKAGE

FIELD OF THE INVENTION

The present invention relates in general to the field of semiconductor product testing, and more particularly to a wafer interposer for testing and assembly into a conventional package.

BACKGROUND OF THE INVENTION

The three stages of semiconductor device manufacture are wafer fabrication, assembly and testing. The testing stage always includes an evaluation of the electrical connections within the device, and often includes burn-in testing as well. In a conventional manufacturing process, before testing is done, the semiconductor wafer is diced into individual semiconductor dies, and the dies are assembled into packages. The purpose of the package is to protect the semiconductor die as well as provide connections that allow the package to be attached to a testing apparatus or printed circuit board. The fact that the testing of the individual dies does not take place until the dies have been packaged, increases the cost. This increased cost stems from the greater complexity, size, and quantity of the testing apparatus, as well as the difficulty of manipulating large quantities of separately packaged dies.

In addition to the tooling and labor costs associated with electrical and burn-in testing of individually packaged dies, there is also the wasted expense of packaging the dies that will subsequently be found to be defective. Since in a conventional process all dies must be packaged before any testing can be done, this means that all defective die will necessarily be packaged, and the expense of doing so is complete waste. For example, if 6%, a conservative estimate, of the dies fail either the electrical or burn-in testing, that is 60 die packaging operations that are wasted for every 1000 dies that are produced. The ability to test the dies before the packaging operations would obviously reduce production costs.

The savings associated with a wafer level testing protocol are multifold. In addition to the savings associated with the elimination of unnecessary packaging operations, inventory carrying costs are reduced because the processing cycle times are reduced since "good" dies are identified earlier in the manufacturing process.

Accordingly, there is a need for a wafer interposer and a method that allows for the testing of semiconductor dies while still assembled in wafer form. It is also important that the wafer interposer and method does not impede the ability to package the dies after they have passed the testing and have been cut from the wafer.

SUMMARY OF THE INVENTION

The present invention provides a wafer testing interposer and semiconductor wafer assembly that allows testing at the wafer level before dicing or singulating. It also allows the direct packaging of the singulated chip assemblies. As a result, the number of manufacturing operations is reduced, which in turn increases first pass yields. In addition, manufacturing time is decreased, thereby improving cycle times and avoiding additional costs.

More specifically, the present invention provides a number of apparatus and methods for interfacing semiconductor wafers containing a multitude of semiconductor dies, with testing equipment. The interposer, and its use when attached to a semiconductor wafer, will greatly improve the processing of semiconductor dies. It will eliminate the need to singulate, package and test each die individually. The savings in time and packaging expense alone will be substantial, but the removal of the defective die at an earlier stage than is currently possible will also add greatly to the economic advantages produced by the present invention.

The present invention provides a wafer testing interposer. The interposer is comprises a support having an upper and a lower surface. One or more solder bumps are on the lower surface. One or more first electrical terminals are on the upper surface, substantially corresponding to the position of the solder bumps, and forming a pattern. One or more first electrical pathways pass through the surface of the support and connect the solder bumps to the first electrical terminals. One or more second electrical terminals are on the upper surface of the support. The second electrical terminals are larger in size and pitch that the first electrical terminals, and they are located within the pattern formed by the first electrical terminals. One or more second electrical pathways connect the first electrical pathways to the second electrical pathways.

The present invention also provides a method for producing a wafer testing interposer including the steps of providing a support having an upper surface and a lower surface. Attaching one or more solder bumps to the lower surface of the support. Attaching one or more first electrical terminals to the upper surface. The attachment of the first electrical terminals substantially corresponds to the position of the solder bumps, and forming a pattern. Creating one or more first electrical pathways passing through the support and connecting the solder bumps to the first electrical terminals. Attaching one or more second electrical terminals to the upper surface within the pattern formed by the first electrical terminals. Attaching one or more second electrical pathways connecting the first electrical terminals to the second electrical terminals.

In addition, the present invention also provides a wafer testing interposer and semiconductor wafer assembly comprising a wafer testing interposer that comprises a support having an upper and a lower surface. One or more solder bumps are on the lower surface. One or more first electrical terminals are on the upper surface, substantially corresponding to the position of the solder bumps, and forming a pattern. One or more first electrical pathways pass through the surface of the support and connect the solder bumps to the first electrical terminals. One or more second electrical terminals are on the upper surface of the support. The second electrical terminals are larger in size and pitch that the first electrical terminals, and they are located within the pattern formed by the first electrical terminals. One or more second electrical pathways connect the first electrical pathways to the second electrical pathways. A semiconductor wafer includes one or more semiconductor dies and having a first and a second surface. One or more third electrical terminals on the first surface of the semiconductor wafer and substantially aligned with the outer edges of the semiconductor dies. The wafer testing interposer aligned with the semiconductor wafer so that the third electrical terminals on the first surface of the semiconductor wafer correspond with the solder bumps on the lower surface of the wafer testing interposer.

Moreover, the present invention also provides a method for producing a wafer testing interposer and semiconductor wafer assembly comprising the steps of creating a wafer testing interposer including the steps of providing a support having an upper surface and a lower surface. Attaching one or more solder bumps to the lower surface of the support. Attaching one or more first electrical terminals to the upper surface. The attachment of the first electrical terminals substantially corresponds to the position of the solder bumps, and forming a pattern. Creating one or more first electrical pathways passing through the support and connecting the solder bumps to the first electrical terminals. Attaching one or more second electrical terminals to the upper surface within the pattern formed by the first electrical terminals. Attaching one or more second electrical pathways connecting the first electrical terminals to the second electrical terminals. Creating a semiconductor wafer including one or more semiconductor dies, and having a first and a second surface. Creating on at least one of the semiconductor dies, one or more third electrical terminals that are substantially aligned with the outer edges of the semiconductor dies. Aligning the wafer testing interposer with the semiconductor wafer so that the solder bumps on the lower surface of the wafer testing interposer correspond with the third electrical terminals on the first surface of the semiconductor wafer.

BRIEF DESCRIPTION OF THE DRAWINGS

The above and further advantages of the invention may be better understood by referring to the following description in conjunction with the accompanying drawings in which corresponding numerals in the different figures refer to the corresponding parts in which.

DETAILED DESCRIPTION

While the making and using of various embodiments of the present invention are discussed herein in terms of a wafer testing interposer and semiconductor wafer assembly apparatus and method, it should be appreciated that the present invention provides many inventive concepts that can be embodied in a wide variety of contexts. The specific embodiments discussed herein are merely illustrative of specific ways to make and use the invention, and in no way meant to limit the scope of the invention.

The present invention provides a wafer testing interposer that can be combined with a semiconductor wafer to form an assembly that can be used to test semiconductor die prior to dicing or singulating. This allows several manufacturing steps to be eliminated and thus results in improved first pass yields, decreased manufacturing times, and improved cycle times.

Additionally, the use of the interposer revolutionizes the processing of semiconductor dies by enabling testing and burn-in at the wafer level. Eliminating the need to singulate and package the dies before testing results in a significant cost avoidance opportunity for chip manufacturers. The fact that the use of the interposer accomplishes all of this while adding no impediment to the packaging of the singulated die produced after successful testing is another substantial benefit of the present invention.

Figure 1:
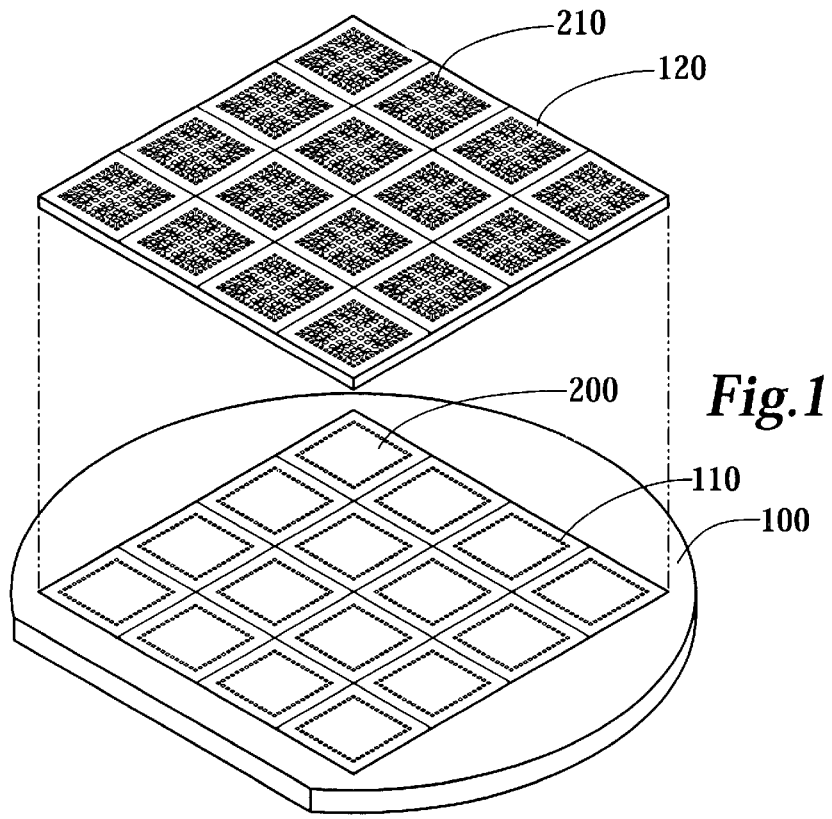
FIG. 1 shows a wafer testing interposer juxtaposed with a semiconductor wafer, in accordance with the present invention.
Figure 2:
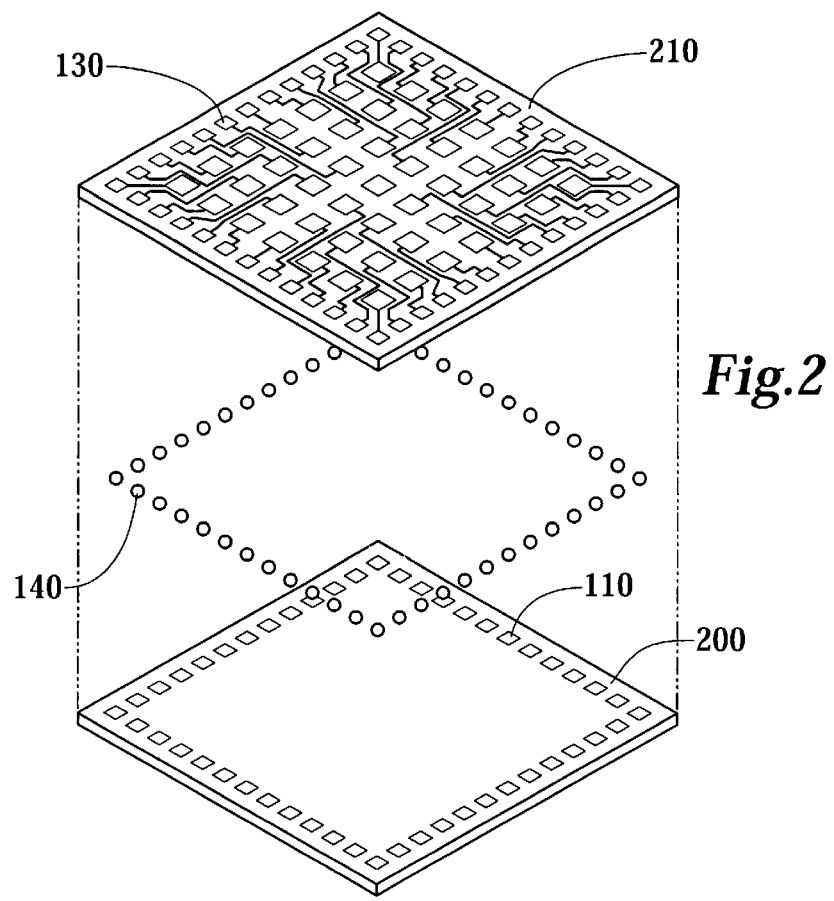
FIG. 2 shows a portion of the lower surface of a wafer testing interposer and a portion of the first surface of a semiconductor wafer in accordance with the present invention.

FIG. 1 shows one form of the invention as a quadrilateral wafer interposer comprising a support 120, which has a set of electrical terminals 130 on the upper surface and solder bumps 140 of FIG. 2 on the lower surface. The solder bumps on the lower surface are aligned with another set of electrical terminals 110 on the surface of the semiconductor die that is part of a semiconductor wafer 100. The solder bumps 140 of FIG. 2 correspond directly to the electrical terminals 110 and a permanent contact can be created between the two by means of heating, or the application of a conductive adhesive. The interposer can be made of any nonconductive material that does not add excessive thickness to the interposer-wafer combination that would complicate the subsequent packaging of the interposer-wafer components produced in the singulating process.

FIG. 2 shows the top of a single semiconductor die 200 with a set of electrical terminals in the form of pads 110 distributed near the outer edges of the die and creating a quadrilateral pattern. A corresponding portion of the lower side of the interposer 210 is also shown, and the solder bumps 140 on it can be seen to form a similar quadrilateral pattern to the pads on the semiconductor die.

Figure 3:
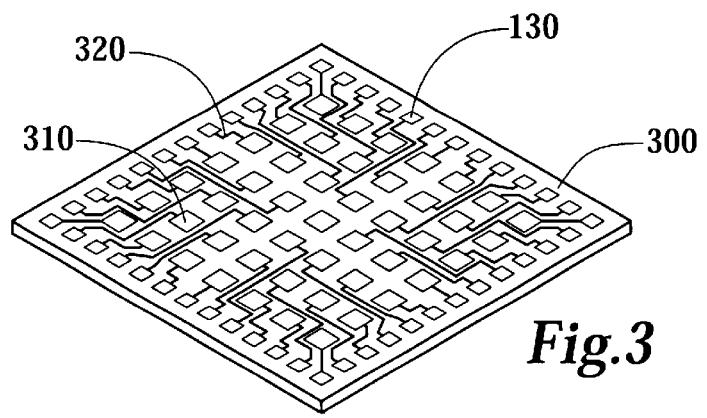
FIG. 3 shows an enlarged view of a portion of the upper surface of a wafer testing interposer in accordance with the present invention.

FIG. 3 shows a portion of the upper surface of an interposer 300 that would cover a single semiconductor die. Two sets of electrical terminals in the form of pads are shown. The first set 130 correspond to the position of the solder bumps on the lower surface of the interposer. The second set of pads 310 are contained within the quadrilateral shape formed by the first set 130. The second set of pads 310 allow for the testing and burn-in of the semiconductor dies while they are still part of a semiconductor wafer. The two sets of pads are connected by electrical pathways 320, which can be either on the surface of the support 300, or in the alternative, within the support. There is a one to one correspondence between the 130 pads and the 310 pads. In order to facilitate the testing and burn-in, the pads 310 are larger in size and have greater pitch that the 130 pads. The greater size of the 310 pads allows for the use of existing contact methods in the testing and burn-in of the die before singulating the semiconductor wafer. During the parametric and burn-in testing, a map of the "level of goodness" of the dies can be prepared so that subsequent processing will only use the dies which meet the requirement of the particular application they are to be used in. By identifying the dies that do not have the required "level of goodness" while they are still part of the semiconductor wafer, unnecessary packing of defective dies is eliminated, and the subsequent steps in the production sequence are made more efficient since the defective dies have been removed at the earliest possible stage in the process.

Figure 4:
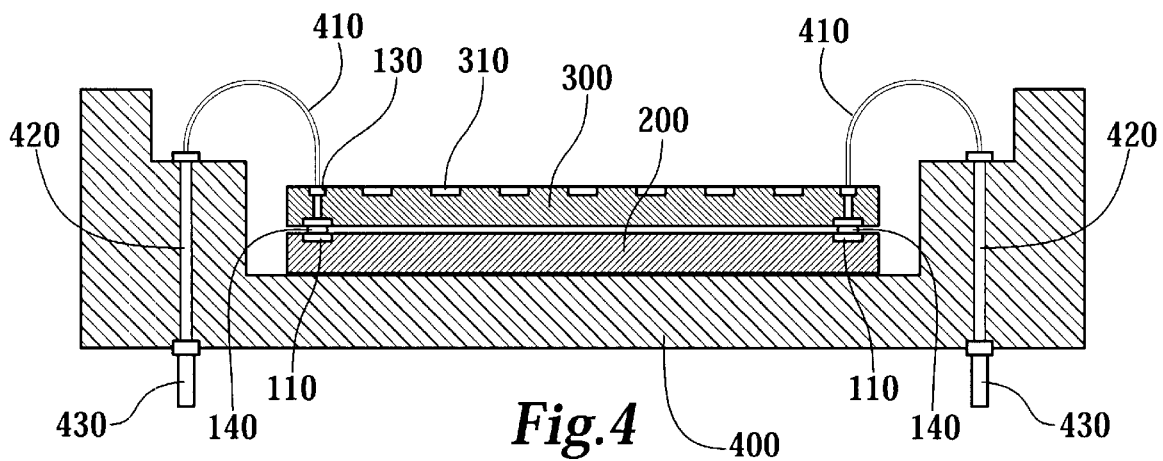
FIG. 4 shows a chip assembly after it has been singulated from wafer testing interposer and semiconductor wafer assembly and mounted in a chip package in accordance with the present invention.

FIG. 4 shows a singulated wafer interposer 300 and semiconductor die 200 assembly mounted in a conventional semiconductor package. The tested singulated semiconductor die 200 is attached to the corresponding section of wafer testing interposer 300 and attached into the package 400. The present invention is compatible with all existing semiconductor packages, including, but not limited to, Ball Grid Arrays, Lan Grid Arrays, Dual In-line packages, as well as Chip Scale packages. Connection of the singulated dies to the package is accomplished by using wire bonds 410. A gold or aluminum wire is bonded to each topside pad 130 on the die and to a corresponding package pad. The connection is continued from the package pad through the body of the package 400 by vias 420 and electrical pathways 430. The leads 430 that exit the package are in turn used to attach the package to a printed circuit board or other connection vehicle, whichever is appropriate for the particular application involved.

The singulated die and interposer combination can also be wire bonded or flip chip assembled directly to the printed circuit board when space is at a premium. It can also be wire bonded of flip chip assembled directly to any contactable surface in any configuration as required by the application. Examples of applications for direct attachment include watches, aircraft skin, intelligent pens, and medical instruments. In flip chip applications the use of an underfill is desirable, and the present invention is compatible with all currently available underfill materials. In the applications mentioned above, it is most likely that a no-flow underfill would be the best option.

What is claimed is:

1. A wafer testing interposer comprising:
   a support having an upper surface and a lower surface;
   one or more solder bumps on the lower surface;
   one or more first electrical terminals on the upper surface that substantially correspond with the solder bumps, and form a pattern;
   one or more first electrical pathways passing through the support, and connecting the solder bumps to the first electrical terminals;
   one or more second electrical terminals on the upper surface, and within the pattern formed by the first electrical terminals;
   the second electrical terminals having greater size and pitch than the first electrical terminals; and
   one or more second electrical pathways connecting the first electrical terminals to the second electrical terminals.

2. A wafer testing interposer as recited in claim 1 wherein at least one of the second electrical pathways is within the support.

3. The wafer testing interposer as recited in claim 1, wherein one or more of the second electrical terminals comprise one or more connectors added to the wafer testing interposer.

4. The wafer testing interposer as recited in claim 1, wherein one or more of the second electrical terminals comprise one solder connections.

5. A wafer testing interposer and semiconductor wafer assembly comprising:
   a wafer testing interposer comprising a support having an upper surface and a lower surface, one or more solder bumps on the lower surface, one or more first electrical terminals on the upper surface that substantially correspond with the solder bumps, and form a pattern, one or more first electrical pathways passing through the support, connecting the solder bumps to the first electrical terminals, one or more second electrical terminals on the upper surface, and within the pattern formed by the first electrical terminals, the second electrical terminals having greater size and pitch than the first electrical terminals, and one or more second electrical pathways connecting the first electrical terminals to the second electrical terminals;
   a semiconductor wafer including one or more semiconductor dies, and having a first surface and a second surface, the semiconductor dies having one or more third electrical terminals on the first surface of the semiconductor wafer, and substantially aligned with the outer edges of the semiconductor dies; and
   the wafer testing interposer aligned with the semiconductor wafer so that the third electrical terminals on the first surface of the wafer correspond with the solder bumps on the lower surface of the wafer testing interposer.

6. The wafer testing interposer and semiconductor wafer assembly recited in claim 5, further comprising singulating the wafer testing interposer and semiconductor wafer assembly into one or more chip assemblies.

7. The wafer testing interposer and semiconductor die assembly as recited in claim 6, further comprising packaging the chip assembly in a chip package.

8. The wafer testing interposer and semiconductor die assembly as recited in claim 7, wherein the chip package is a Ball Grid Array package.

9. The wafer testing interposer and semiconductor die assembly as recited in claim 7, wherein the chip package is a Lan Grid Array package.

10. The wafer testing interposer and semiconductor die assembly as recited in claim 7, wherein the chip package is a Dual In-line package.

11. The wafer testing interposer and semiconductor die assembly as recited in claim 7, wherein the chip package is a Chip Scale package.

12. The wafer testing interposer and semiconductor wafer assembly as recited in claim 5, wherein one or more of the second electrical terminals comprise one or more connectors added to the wafer testing interposer and semiconductor wafer assembly.

13. The wafer testing interposer and semiconductor wafer assembly as recited in claim 5, wherein one or more of the second electrical terminals comprise one or more solder connections.

* * * * *